(12) United States Patent
Darwish et al.

(10) Patent No.: US 8,816,397 B2
(45) Date of Patent: Aug. 26, 2014

(54) RING-SHAPED TRANSISTORS PROVIDING REDUCED SELF-HEATING

(71) Applicant: U.S. Army Research Laboratory, Adelphi, MD (US)

(72) Inventors: Ali Darwish, Overland Park, MD (US); Hingloi Alfred Hung, Bethesda, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 13/724,598

(22) Filed: Dec. 21, 2012

(65) Prior Publication Data

US 2014/0175514 A1 Jun. 26, 2014

(51) Int. Cl.
*H01L 29/66* (2006.01)

(52) U.S. Cl.
USPC ............ 257/194; 257/270; 257/365; 257/401

(58) Field of Classification Search
CPC ............ H01L 29/0603; H01L 29/0692; H01L 29/1066
USPC .................................. 257/194, 270, 365, 401
See application file for complete search history.

(56) References Cited

U.S. PATENT DOCUMENTS

| | | | | |
|---|---|---|---|---|
| 5,525,819 | A | * | 6/1996 | Yarbrough .................... 257/275 |
| 7,541,640 | B2 | * | 6/2009 | Brar et al. ..................... 257/329 |
| 8,466,536 | B2 | * | 6/2013 | Loke et al. .................... 257/531 |
| 2012/0091558 | A1 | * | 4/2012 | Loke et al. .................... 257/531 |

OTHER PUBLICATIONS

Hu, HH. et al., "Temperature-Dependent Capacitance Characteristics of RF LDMOS Transistors With Different Layout Structures" IEEE Electron Device Letter, vol. 29, No. 7, Jul. 2008, pp. 784-787.
Rudolph, M. et al., "Investigation of Thermal Crunching Effects in Fishbone-Type Layout Power GaAs-HBTs," 12th GAAS Symposium, Amsterdam 2004, pp. 435-438.
Eastman, L.F., "AlGaN/GaN microwave power HEMT's," 21st Annual GaAs IC Symposium, 1999, pp. 15-18.

* cited by examiner

*Primary Examiner* — Tu-Tu Ho
(74) *Attorney, Agent, or Firm* — Eric B. Compton

(57) ABSTRACT

A ring-shaped transistor includes a set of gates. Each gate of the set is disposed between a corresponding source and a corresponding drain. The set of gates are arranged such that all of the set of gates cannot be aligned with fewer than three imaginary straight lines drawn through the gates, with one of the imaginary straight lines passing only once though each of the set of gates.

19 Claims, 12 Drawing Sheets

(A)
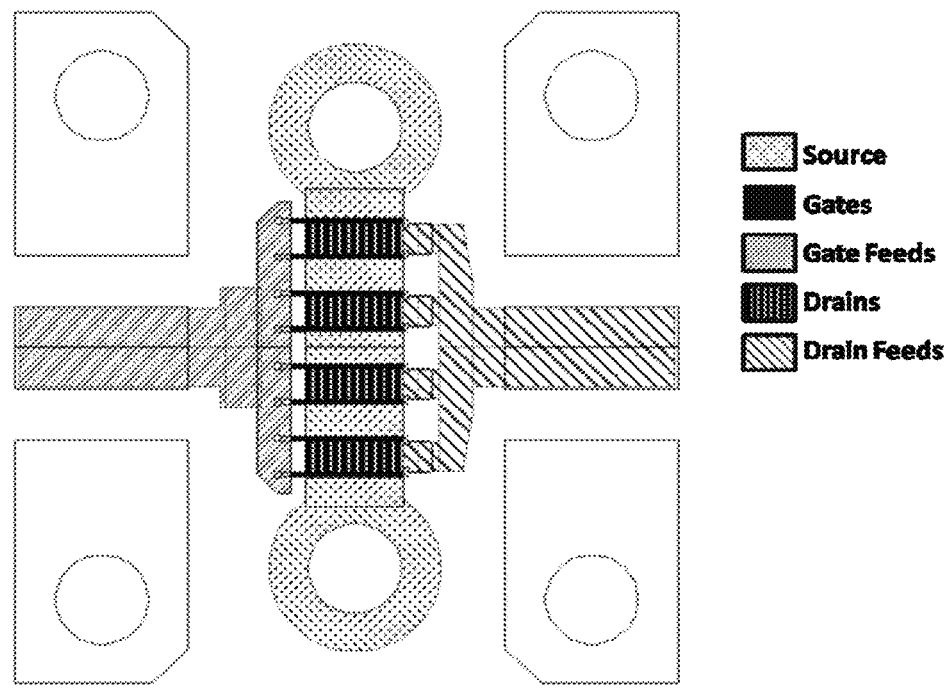
(A)
FIGURE 3
(CONVENTIONAL)

(B)
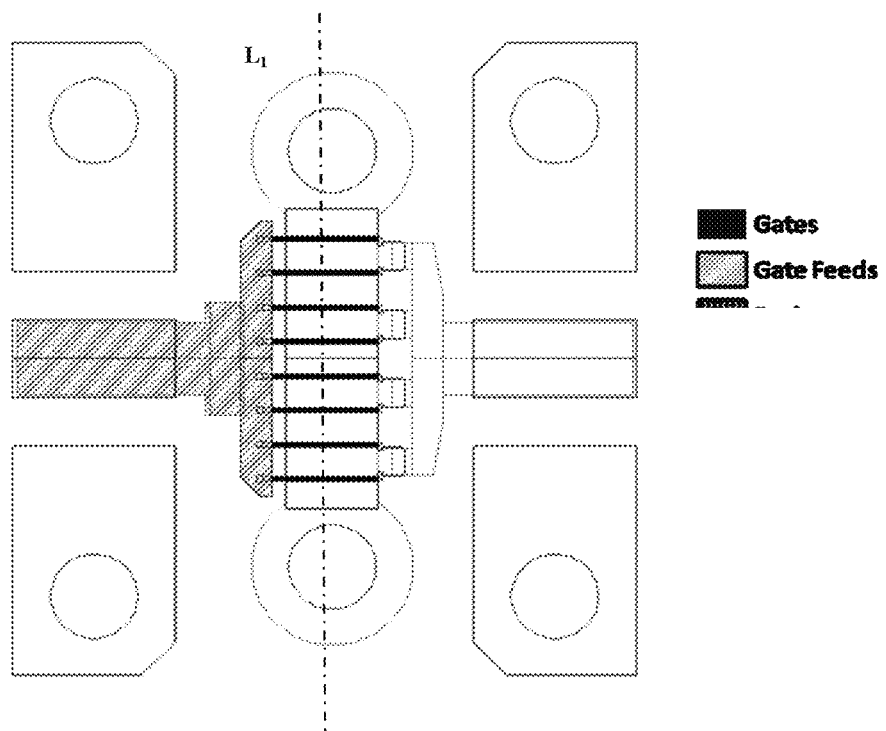
(B)
FIGURE 3
(CONVENTIONAL)

(C)
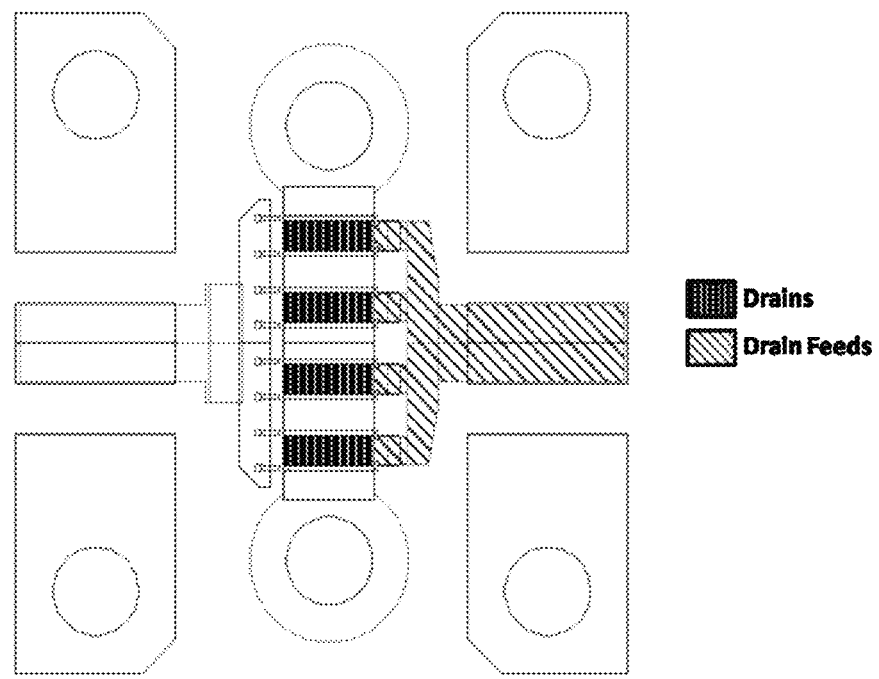
(C)
FIGURE 3
(CONVENTIONAL)

(D)
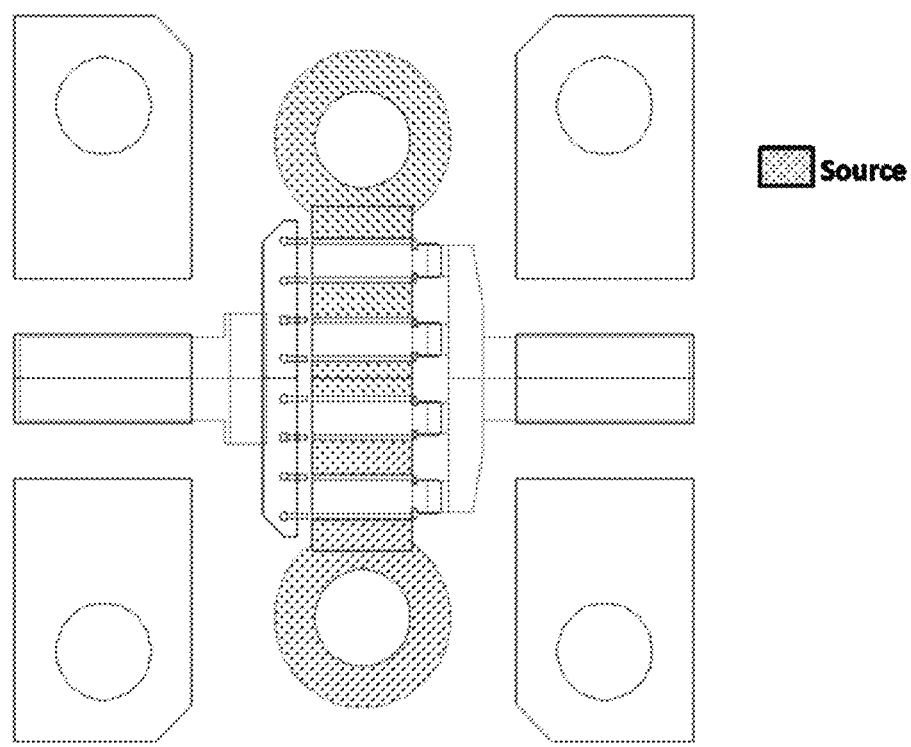
(D)
FIGURE 3
(CONVENTIONAL)

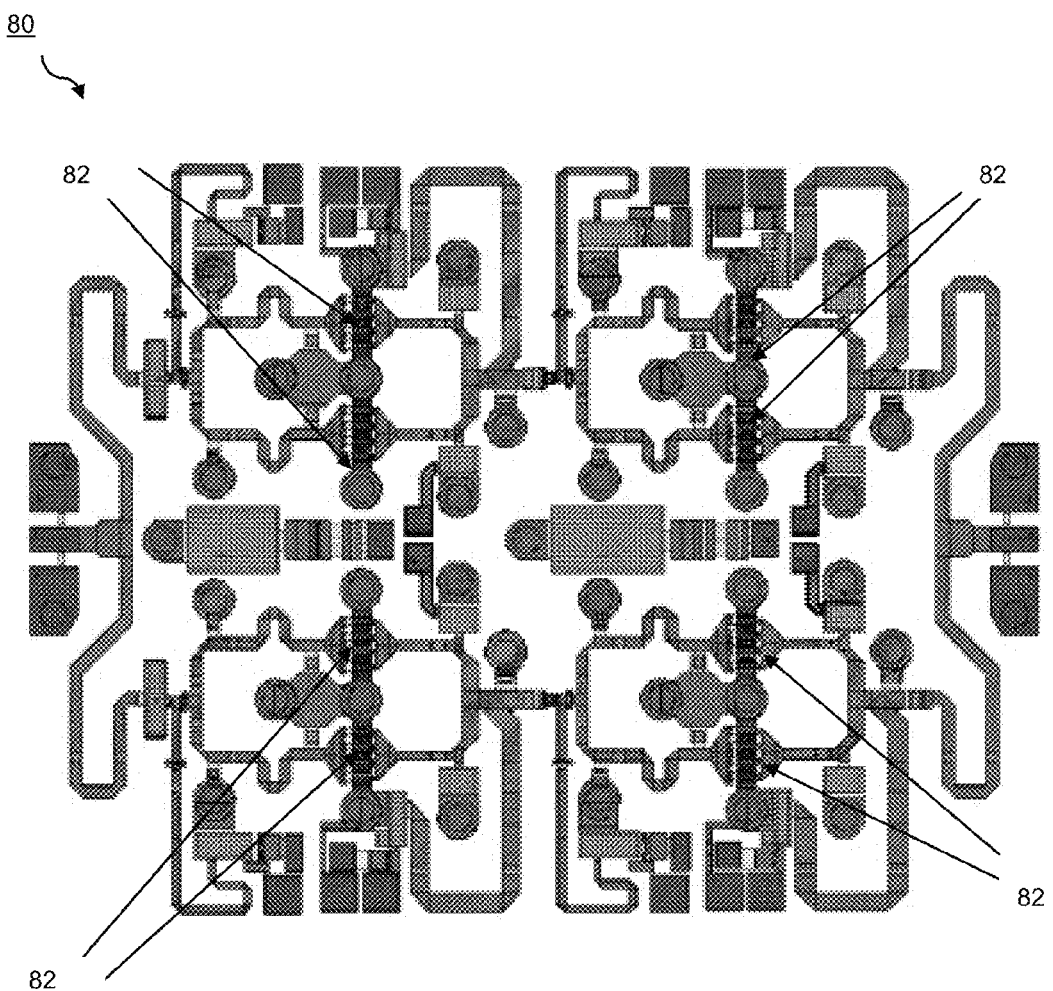
FIGURE 8
*(CONVENTIONAL)*

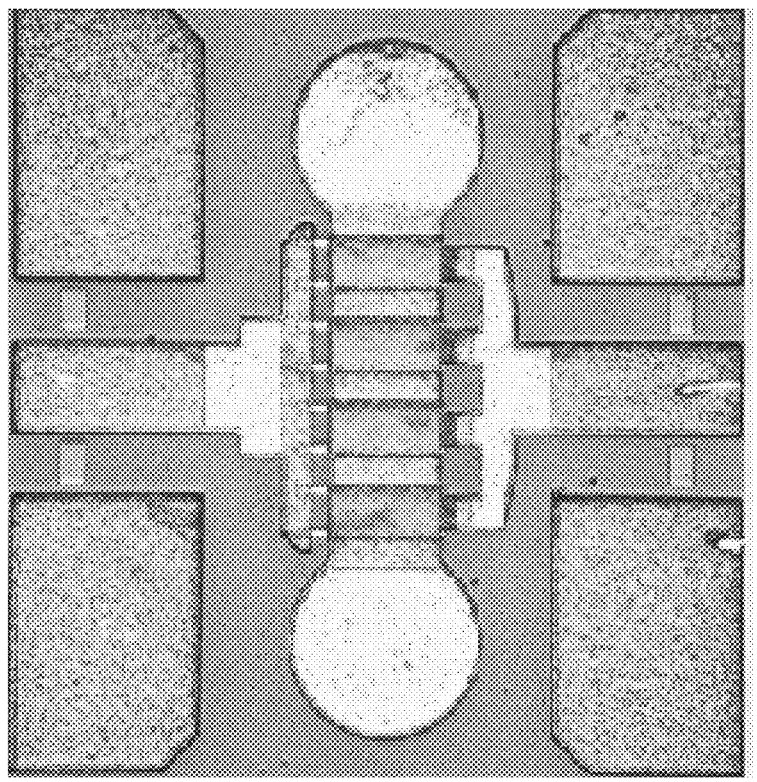
FIGURE 10
(CONVENTIONAL)

RING-SHAPED TRANSISTORS PROVIDING REDUCED SELF-HEATING

GOVERNMENT INTEREST

Governmental Interest—The invention described herein may be manufactured, used and licensed by or for the U.S. Government without the payments of royalties thereon.

BACKGROUND OF THE INVENTION i) Field of Invention

Embodiments of the present invention generally relate to transistors, and in particular to ring-shaped transistors providing reduced self-heating.

ii) Description of Related Art

Electronic devices and integrated circuits have performance limits that are frequently set by the maximum allowable current density, voltage/electric field, and channel (or junction) temperature. Self-heating of these devices is undesirable as it reduces performance and lifetime. The channel temperature $T_c$ is correlated with the device lifetime through the Arrhenius equation, and may be determined through simulations, theoretical models, or experimentally. Channel temperature directly affects the bandgap, electron mobility, electron saturation speed, pinch-off voltage, breakdown voltage, transconductance, saturation current, output power, and noise performance.

Reducing $T_c$ typically leads to enhanced device performance, and reliable, sustainable operation. Heating in transistors may lead to memory effects which cause linearity degradation. Channel temperature is directly proportional to power dissipation through the thermal resistance constants. It also depends critically on the device layout. In the case of field effect transistors (FETs) and high electron mobility transistors (HEMTs), $T_c$ increases with the thermal resistance constant, and depends on the gate-width, gate-length, gate-pitch, and substrate thickness and thermal conductivity. Transistor heating is a primary cause of memory effects which degrade linearity of power amplifiers, especially for modulated signals, for instance.

Conventional approaches, such as increasing gate-pitch dimension, result in larger device size and performance degradation especially at millimeter-wave frequencies. Additionally, transistor heating is a cause of memory effects which degrade linearity of power amplifiers, especially for modulated signals.

BRIEF SUMMARY OF THE INVENTION

Embodiments of the present invention relate to ring-shaped transistor devices providing reduced self-heating.

According to one embodiment, a ring-shaped transistor includes a set of gates, each gate being disposed between a corresponding source and a corresponding drain; wherein the set of gates are arranged such that all of the set of gates cannot be aligned with fewer than three imaginary straight lines drawn through the gates, with one of the imaginary straight lines passing only once though each of the set of gates.

According to another embodiment, a method of fabricating a ring-shaped transistor includes forming a ring-shaped transistor comprising a ring-shaped transistor comprising: a set of gates, each gate being disposed between a corresponding source and a corresponding drain; wherein the set of gates are arranged such that all of the set of gates cannot be aligned with fewer than three imaginary straight lines drawn through the gates, with one of the imaginary straight lines passing only once though each of the set of gates.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. Unless otherwise stated, relative sizes of the features illustrated in the drawings are not to scale. It is to be noted, however, that the appended drawings illustrate only a few embodiments of this invention and are therefore not to be considered limiting of its scope, for the invention may admit to other equally effective embodiments These embodiments are intended to be included within the following description and protected by the accompanying claims.

FIGS. 3A-3D illustrate a conventional FET.

FIG. 8 illustrates a layout of a conventional power amplifier MMIC having eight HEMT cells.

FIGS. 9 and 10 are photographs of a ring-shaped HEMT according to an embodiment and a conventional HEMT, respectively, which were fabricated.

DETAILED DESCRIPTION OF THE INVENTION

According to embodiments of the present invention, a ring-shaped layout or structure for a transistor is disclosed in which gates are arranged into a ring-like configuration and increasing the separation among them, thereby reducing channel temperature. Simulations and experimental verification indicate a significant heat reduction as a result of the new innovative layout leading to improvement in device performance.

Embodiments described herein are primarily directed to FETs. A FET is one of two main classifications of transistors in terms of construction and function; the other type of transistor being a bipolar junction transistor (BJT). FETs can be implemented in a variety of different ways using semiconductor materials formed on a substrate by typical semiconductor fabrication processes. For example, Gallium Nitride (GaN) high-electron mobility transistors (HEMTs) are one implementation of FETs. When transistors are operated, they consume power from a direct current (DC) source or from an alternating (or pulsed) current (AC) source, for instance, to radio frequency (RF) output power in many applications. Table 1, below, shows the electrical schematic, and heat source and sink areas for a FET.

TABLE 1

FET characteristics

| Transistor | FET |
|---|---|
| Electrical Schematic | (schematic showing Gate, Drain, Source) |
| Heat Source | close to gate |
| Heat Sink | Substrate |

Heating in transistors affects the electrical performance adversely, in most cases. As such, it is desirable to reduce maximum temperature. Most of the heating in FETs happens in the vicinity close to the gate junction.

Figure 1:
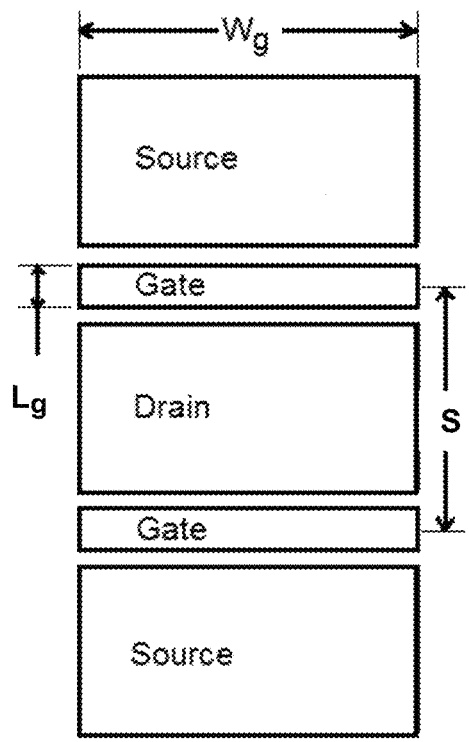
FIG. 1 illustrates a generic, schematic of the core elements of a field effect transistor (FET) layout that was analyzed by the inventors.

FIG. 1 illustrates a generic, schematic of FET layout that was analyzed by the inventors. This is a generic layout for both HEMT and FET from a top plan view. The high electron mobility transistor (HEMT) is a type of FET with specific epitaxy material. The actual device for which this layout corresponds to is conventional, but not shown.

The transistor structure may be considered a plurality of highly localized heat sources on a substrate having a thickness t. Here, the heat sources represent the gates of the device with a length $L_g$, a width $W_g$ and a gate-gate pitch S. The semiconducting region directly below the gate is called the channel. The semiconducting channel may be formed from a semiconductor material such as gallium nitride (GaN), for instance. Other semiconductor materials may also be used to form the semiconducting channel. Here, the thermal conductivities of the semiconductors and substrate are $k_{Gan}$, and $k_{sub}$, respectively.

The channel temperature may be calculated using a numerical simulator or the closed form expression. For instance, in FIG. 1, the temperature in each gate may be influenced by, (a) the self-heating of that gate, and (b) the cross-heating caused by nearby gates(s).

Reducing self-heating of a gate may be accomplished by increasing the gate length $L_g$, and decreasing substrate thickness t, and power dissipation (per mm) of gate width, $P_{mm}$. In a typical device fabrication process, however, the length $L_g$ and thickness t cannot be readily changed by the circuit designer. Reducing $P_{mm}$ by increasing device power-added-efficiency is a well recognized goal for designers, and it is the focus of numerous research groups. Another option is to reduce cross-heating from neighboring gate-strips which can be achieved by increasing the gate-pitch S. Yet, this may come at the expense of larger area, leading to (i) wider drain pads, (thus, a larger drain-source capacitance $C_{ds}$) and, (ii) wider source pads (thus, a greater source inductance $L_s$). Increasing $C_{ds}$, generally reduces bandwidth, gain, and makes it more difficult to match the output of the device. Additionally, increasing the phase discrepancies between different gate paths reduces output power and gain. These effects generally become more significant at mm-wave frequencies. Thus, there is a tradeoff between channel temperature and various electrical performance metrics.

An important aspect in the ring-shaped transistor layout is the ability to separate the gates by a large spacing (to reduce heating). In addition, the ring-shaped layout may also enable the gates, drains, and sources to be connected in a way that can preserve the electrical performance and make the path length equal for all gate/source/drain junctions.

The ring-shaped transistor structure is an arrangement of a set of gates such that all of the set of gates cannot be aligned with fewer than three imaginary straight lines drawn through the gates, with one of the imaginary straight lines passing only once though each of the set of gates. The imaginary straight lines may be assumed to have a negligible width.

Figure 5:
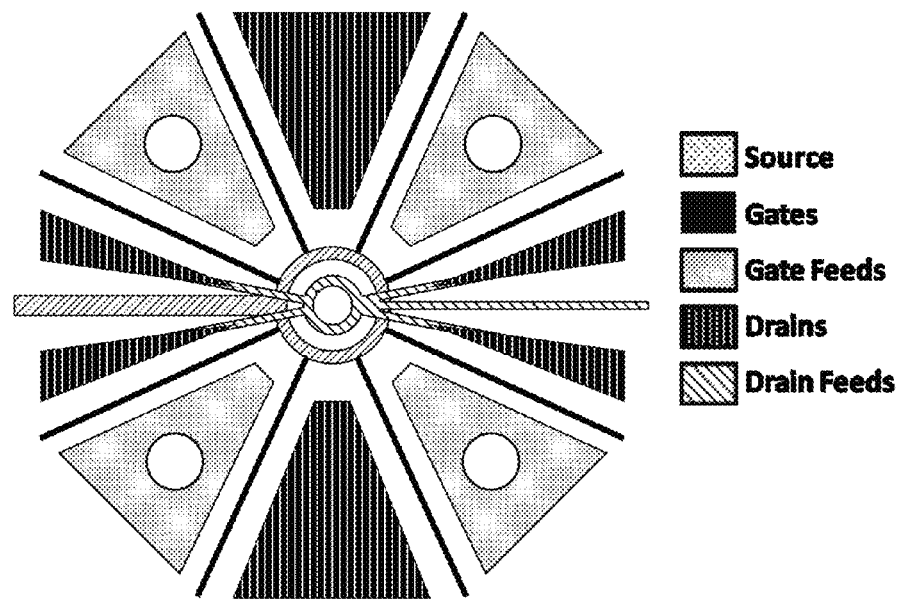
FIG. 5 illustrates another ring-shaped FET according to an embodiment.

In some embodiments, the gates may be aligned so as to be generally parallel in the same direction to one another as shown in FIG. 2A-2D However, in other embodiments, the ring-shaped transistor structure may include a non-parallel arrangement of the gates, such as in a radial configuration as shown in FIG. 5.

The gates of the ring-shaped transistor may be formed by conventional techniques (such as lithography), with gates of the same channel being connected via conductive pathways, i.e., gate feeds. The locations of the different gates and thus, signal channels may be designed so as to increase the separation among them, thereby reducing channel temperature. The dimensions of the gates may typically have lengths from 0.02-2 μm, width from 20-1000 μm, and thickness from 0.1-5 μm, for instance. And, the conductive pathways leading to/from the gates may be equal to (or more than) the number of gates.

FIGS. 2A-2D illustrate one ring-shaped FET according to an embodiment.

Figure 2:
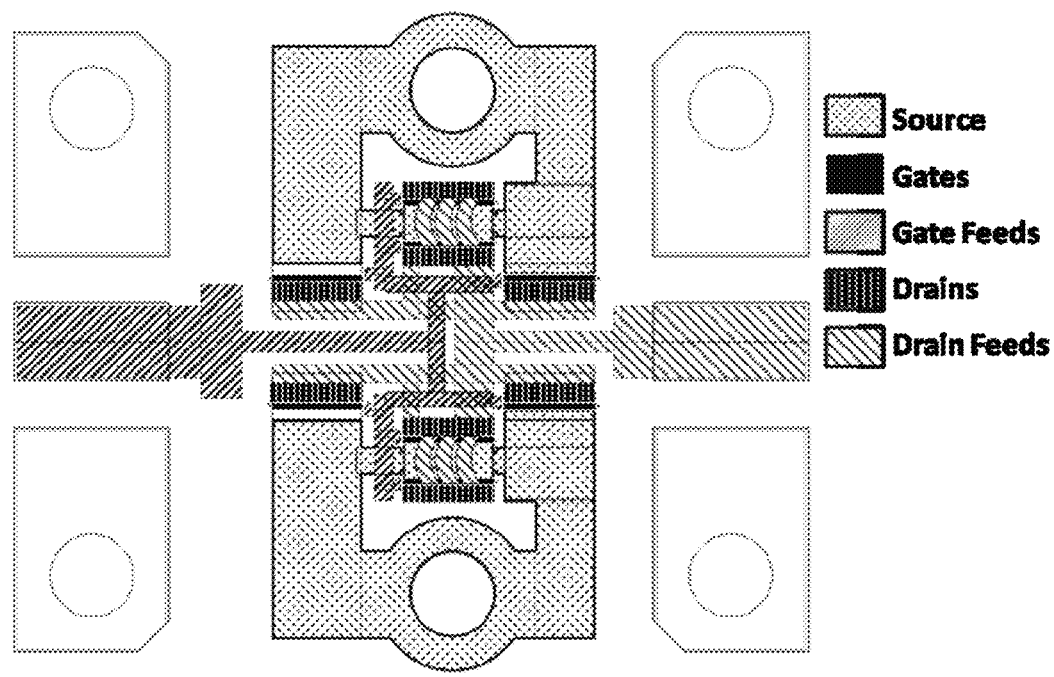
FIGS. 2A-2D illustrate one ring-shaped FET according to an embodiment.
Figure 2:
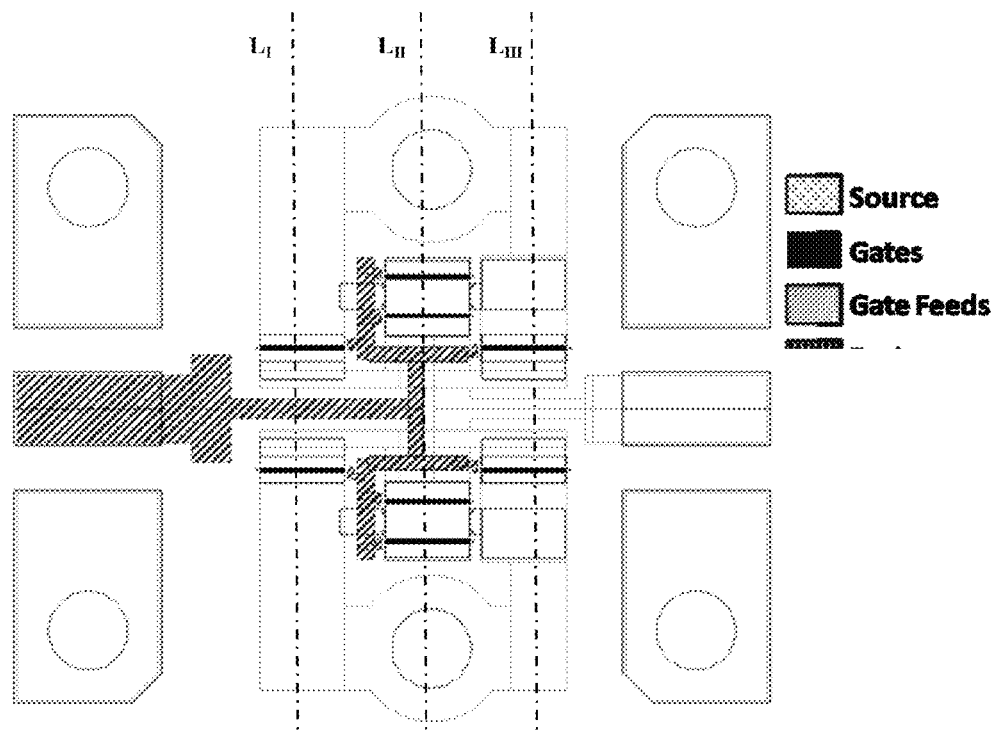
Figure 2:
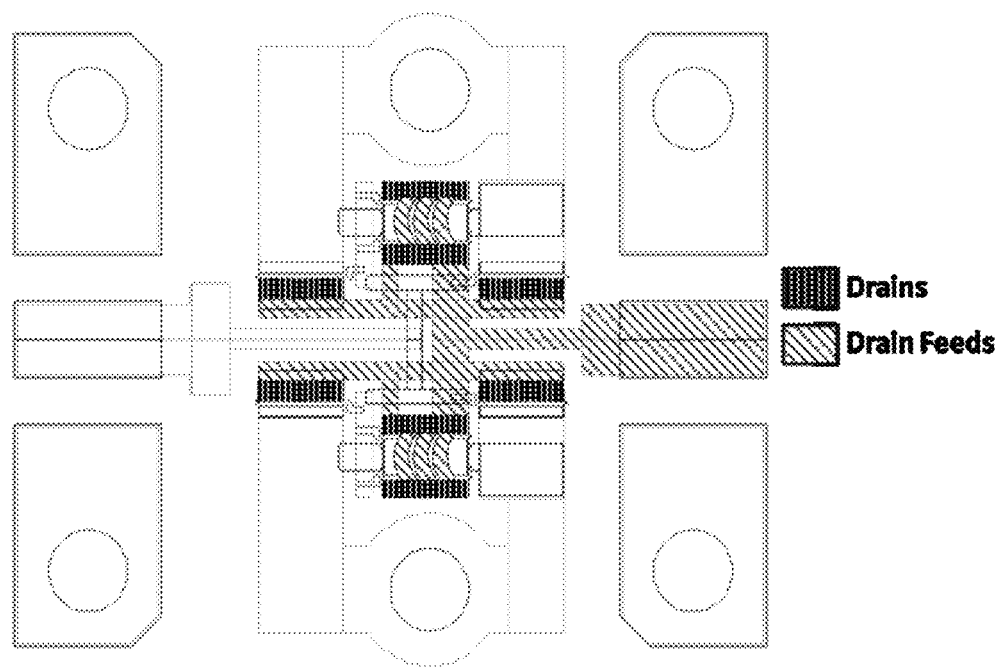
Figure 2:
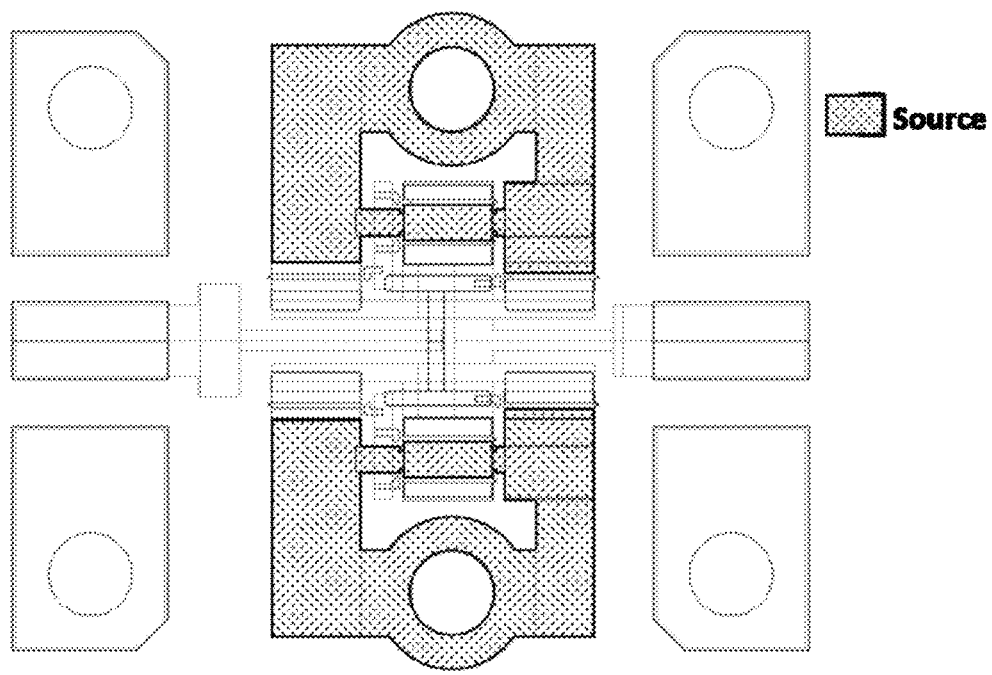

FIGS. 3A-3D illustrate a conventional FET for comparison sake with the innovative ring-shaped FET illustrated in FIGS. 2A-2D. FIGS. 2A-2D and FIGS. 3A-3D show various elements: sources, gates, gates feeds, drains, and drain feeds according to the accompanying legends identifying each. Simply for ease of comparison and explanation, FIGS. 2B-2D and FIGS. 3B-3D identify less structure than illustrated in FIG. 2A and FIG. 3A. Otherwise, the same structure is illustrated in FIGS. 2A-2D and FIGS. 3A-3D, respectively. In particular, FIG. 2B and FIG. 3B identify the gates and gates feeds of the respective transistors. FIG. 2C and FIG. 3C identify the drains and drain feeds of the respective transistors. And FIG. 2D and FIG. 3D identify the sources of the respective transistors.

There are eight (8) gates present in both the ring-shaped FET and the conventional FET shown. The number of gates of the ring-shaped FET is not limiting and is mere exemplary in the figures for explanation. The layouts shown here, however, do not show all layers in a finished device. For instance, gates of the conventional FET and ring-shaped-FET are illustrated. In a finished device, air-bridges electrically connecting the source islands (e.g., pads) over the gates in the conventional FET, and the outer drain pads over the active regions in the gate segments of the ring-shaped-FET. The circular holes in corners of the transistor and the source regions represent conductive vias which can be filled with metal or other conductors for providing conductive pathways to ground for the sources' terminal, and RF signal.

As best depicted in FIG. 2B, the gates of the ring-shaped FET are connected by one or more conductive pathways, i.e., the gate feed, and are arranged in a generally circuitous or serpentine arrangement. The gate feed consists of at least two gate-feed patterns or segments (which do not form a straight line). Generally, the gate-feed may have a symmetric pattern. In this way, the gates need not have fixed gate-gate spacing among sets of gates. Yet, the path length may be made substantially equal to all gate/source/drain junctions. In addition, the drains may be connected by one or more conductive pathways, i.e., the drain feed, and can be arranged in a generally circuitous or serpentine arrangement also.

The different gates of the ring-shaped FET can be aligned with no fewer than three parallel imaginary straight lines $L_I$, $L_{II}$, $L_{III}$ drawn through the gates, with one imaginary straight line passing only once though each of the set of gates. Here, the three parallel imaginary straight lines $L_I$, $L_{II}$, $L_{III}$ have been drawn perpendicular to the width $W_g$ direction of the gates (which also happens to be aligned with the length $L_g$ direction of the gates here). The width and length directions for gates are shown in FIG. 1.

In contrast to the ring-shaped FET, as best depicted in FIG. 3B, the gates of the conventional FET can be aligned with a single parallel imaginary straight line $L_I$ drawn perpendicular to the width $W_g$ direction of all the gates with each gate having the same imaginary straight line $L_I$ passing through it only once. While this arrangement may be advantageous for electrical performance, it is quite disadvantageous for thermal performance.

Indeed, no one imaginary straight line can be drawn which physically aligns with all the gates of the ring-shaped FET in a similar manner as the conventional FET due to the circuitous or serpentine layout of the gates.

In FIG. 2B and FIG. 3B, the imaginary straight lines have been drawn substantially through the mid-point in the width direction of each gate. However, it should be appreciated that a imaginary straight lines could be drawn aligning with the beginnings of the gates or aligning with ends of the gates in the region where transistor action occurs so long as one imaginary straight line passed only once though each of the set of gates. Indeed, various imaginary straight lines might be similarly drawn between beginning and ends of the gates, but only one such line can be used for passing through the gate. The imaginary straight lines may be assumed to have a negligible width.

Figure 4:
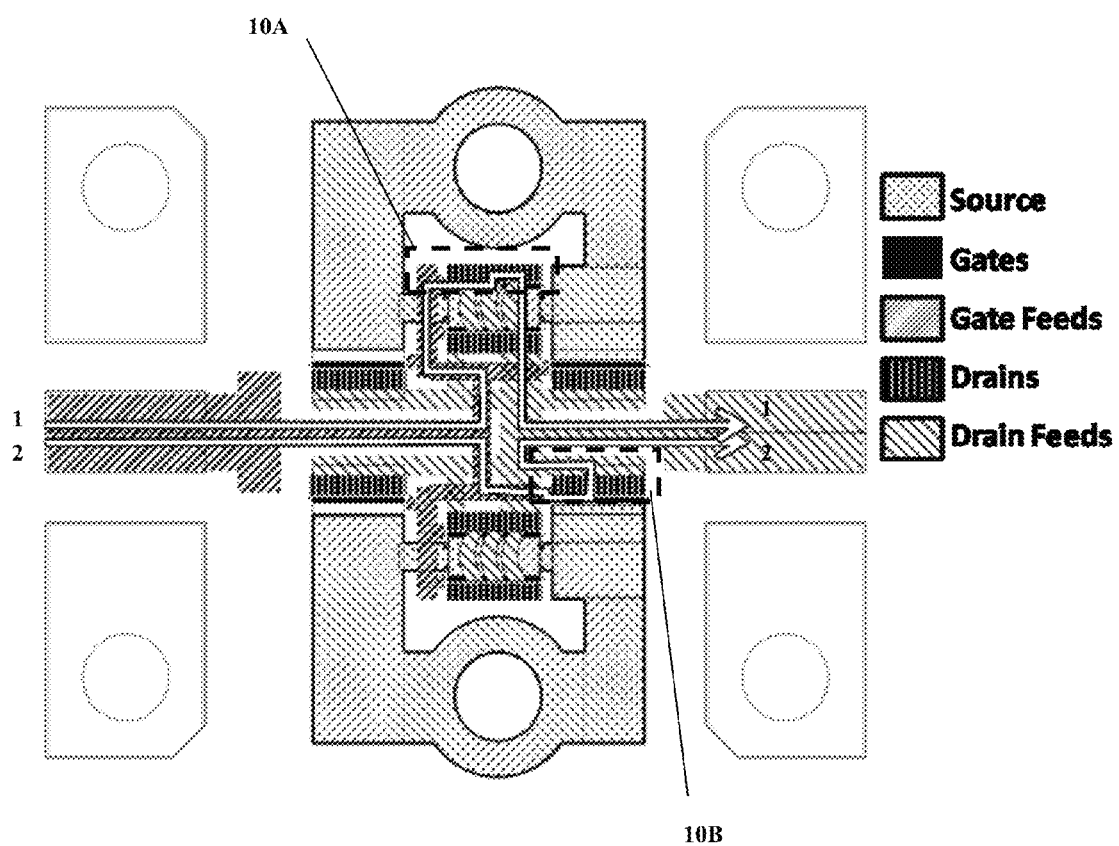
FIG. 4 illustrates the signal path courses through the ring-shaped FET illustrated in FIGS. 2A-2D.

FIG. 4 illustrates two signal path courses through the ring-shaped FET illustrated in FIGS. 2A-2D. In this figure, two of the eight signal paths present and corresponding courses are illustrated as the white arrows and have been annotated as channel 1 and channel 2 for clarity; although it should be appreciated that six other channels (for a total of eight) are present in the ring-shaped FET. The signal path course, placement and/or size vary for the gate/source/drain junctions for different channels.

In ring-shaped FETs, there is typically one gate per signal path. Source islands and drains placements and/or configurations will largely be dependent on the configuration of the gates. Signal path 1 controls a first gate 10a and signal path 2 control a second gate 10b. In particular, signal path 1 and signal path 2 are different in their course, yet both signal path 1, and signal path 2 have roughly equal length.

The signal paths are not a single conductive pathway. Rather, they represent the path of an input signal and output signal of the device with respect to a particular gate. An input control signal may be provided to each gate via the gate feed. The control signal modulates charge carriers from the source to the drain corresponding that that gate. The combined signal in the drain (and others) is then output vie the drain feeds. The output signal may have an amplified gain with respect to the input control signal to the gate. One example embodiment of the control signal input to the gate modulating the charge carrier between the corresponding source and drain is further illustrated in FIG. 6.

Maintaining equal length ensures that signals traveling along different signal paths accumulate equal time delay (hence, phase delay) and add coherently. This is critical for the electrical performance. Other configurations are possible. For example, there may be many signal paths in some ring-shaped transistor embodiments. Typically, the number of channels (i.e. signal paths) equals the number of gates. In a conventional FET, the number of gates varies from 4-20. It is possible, but not common, to have transistors with fewer gates than 4, or more gates than 20. The ring-shaped transistor may be configured to have a similar number of channels to a conventional FET, but need not be so.

FIG. 5 illustrates a top plan view of yet another ring-shaped FET according to an embodiment. The figure shows various elements: sources, gates, gates feeds, drains, and drain feeds according to the accompanying legend identifying each.

Here, the gate feed and drain feed both include lead portions and center ring portions, with the lead portion of the gate feed coming in from the left to the center ring portion of the gate feed and the lead portion of the drain feed going away from the center ring portion of the drain feed toward to right in the drawing. The gate feed and the drain feed are electrically isolated from one another in actuality, and may be formed at different depths (or planes) within the transistor device. While the center ring portion of the drain feed is depicted inside of the center ring portion of gate feed, the two elements can be reversed.

The gates form thin radial segments (depicted as lines) that are connected to and depend from the central ring of the gate feed to provide the greatest separation between the various gates (thereby increase spacing between these heat generating elements). Similarly, the drain islands are formed radially and connected with the center ring portion of the drain feed. The ring structure for the gate and drain ensure that various channels (signals paths from input to output) have similar length, thereby maintaining optimal or improved electrical performance. The source islands, also, are similar to maintain symmetry for the various gate/source/drain junctions, and ensure coherent addition. While eight gates are depicted in the drawing, it should be appreciated that the number of gates may vary from what is shown; there may be fewer or additional gates and their associated sources and drains. The circular holes in source islands represent vias which can be filled with metal for providing conductive pathways to ground through the substrate. As should be appreciated, the various gates can be aligned with no fewer than three parallel imaginary straight lines drawn through the gates, with one imaginary straight line passing only once though each of the set of gates.

Figure 6:
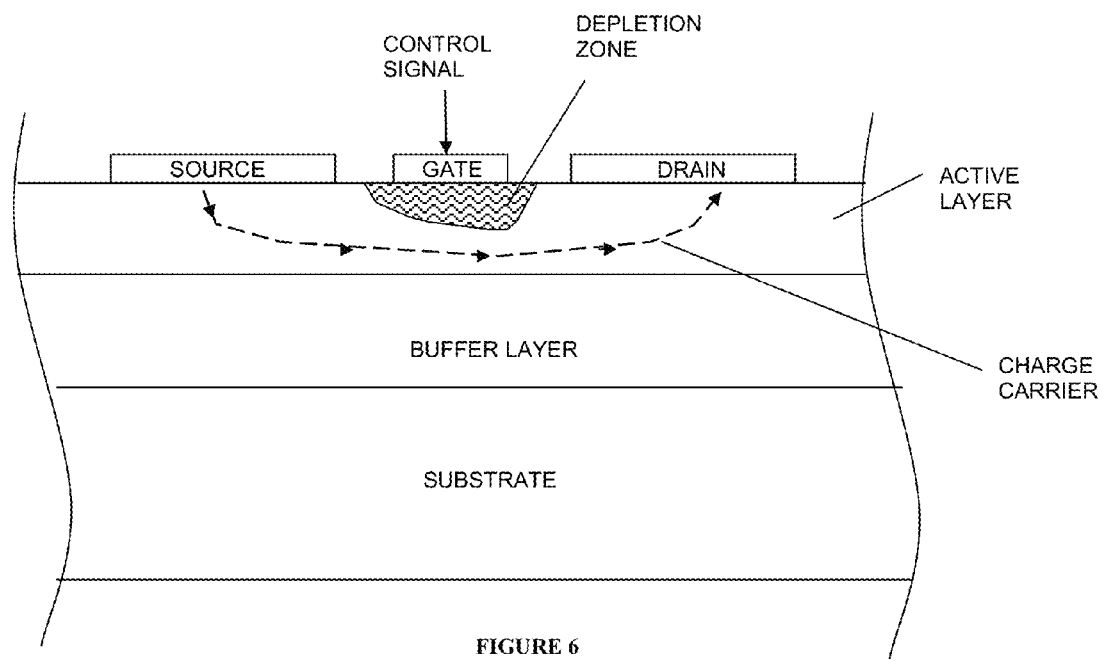
FIG. 6 is a cross-sectional view of one ring-shaped FET according to an embodiment.

FIG. 6 is a simplified cross-sectional view of one ring-shaped FET according to an embodiment. This cross-sectional view depicts one gate disposed between its corresponding source and drain. The size and shape of the gate, source and drain will depend of the particular layout of the ring-shaped FET. Gate and drain feeds may also be present in the FET but are not depicted in this particular cross-sectional view.

The ring-shaped FET may generally include a buffer layer formed on a substrate, an active layer formed on the buffer layer, and sources, gates, and drains, respectively formed on the active layer. The buffer layer may be epitaxally formed. i.e., an epilayer, which enables growing of the active layer on the substrate, which may be incompatible materials in terms of crystalline structure. Also, the buffer layer helps to prevent defects in substrate from propagating to the active layer. A buffer layer may not be needed for all embodiments though, and might be optional for a MESFET, for instance. It should also be appreciated that other elements (such as a capping layer formed on the active layer in the vicinity underneath of the gate) may be present in various embodiments, but have not been depicted therein. Other types of transistor structures are possible in other embodiments.

Transistor action takes place in the active layer. It may be epitaxally formed on the buffer layer. In general, charge carriers flow from the source to the drain, underneath the gate through a depletion layer in the active layer. RF signals input to the gate modulates the depletion zone in the active layer resulted from a voltage applied to the gate and source terminals. The size, shape and/or depth of the depletion zone vary based on gate-to-source bias voltage and the applied signal strength (amplitude), although the depletion zone will tend to gravitate slightly in the direction toward the drain. This drawing is not to scale; in actuality, the active layer may be much thinner in thickness than the substrate and buffer layer, and the buffer layer is thinner than the substrate.

Figure 7:
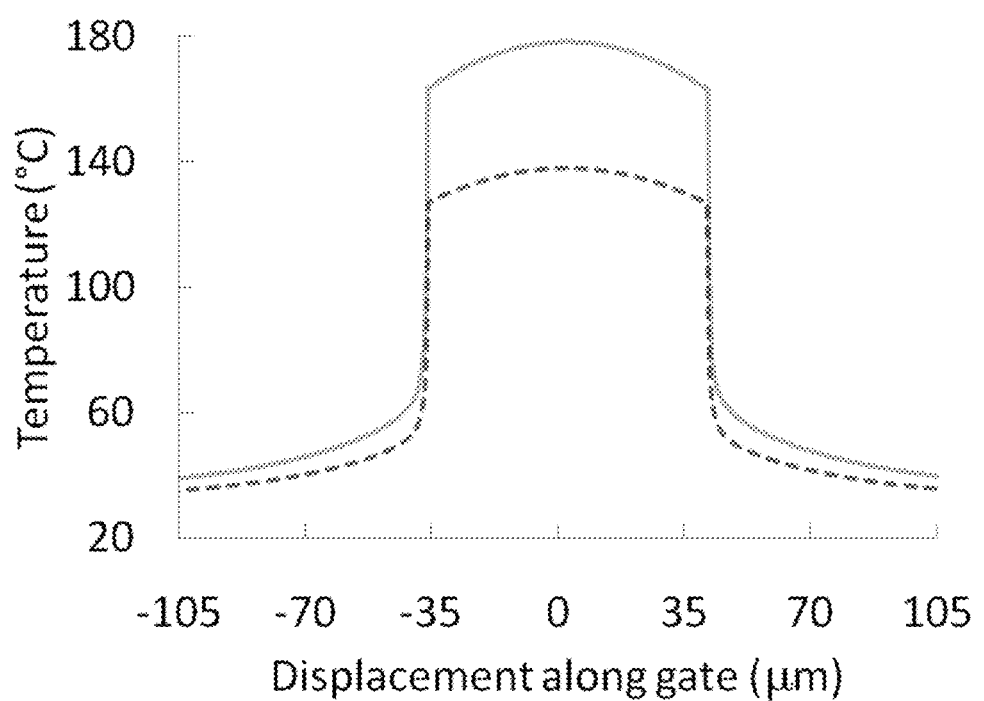
FIG. 7 is a plot that shows channel temperature along center line of the gate (high heat generation region) for a conventional HEMT, and a ring-shaped HEMT according to an embodiment.

FIG. 7 is a plot that shows channel temperature along center line for a conventional HEMT (solid line), and a ring-shaped HEMT (dashed line) according to an embodiment.

A numerical simulator (e.g., ANSYS), with nonlinear thermal conductivity, was used to calculate the channel temperatures for the two HEMTs which assumed a base plate temperature of 25° C. The temperature in the conventional HEMT reaches 178.2° C., while the ring-shaped HEMT reaches 138.1° C., under the same power dissipation. That is equivalent to a 30% drop in thermal resistance which is very significant in terms of reliability.

The device reliability is strongly dependent on channel temperature. It may be determined using the Arrhenius equation, as follows:

$$\ln\left(\frac{MTF_2}{MTF_1}\right) = \frac{E_a}{k_b} \cdot \left(\frac{1}{T_2} - \frac{1}{T_1}\right), \quad (1)$$

where $MTF_{1,2}$ is the mean-time-to-failure or (MTTF), $E_a$ is the activation energy, $T_{1,2}$ are the absolute temperature in degree Kelvin, and $k_b$ is the Boltzman constant ($8.6 \times 10^{-5}$ eV/K). Evaluating the expression for GaN with $E_a$=1.5 eV, $T_1$=138.1° C., $T_2$=178.2° C., gives $MTF_2/MTF_1$=$e^{3.77}$=43.4. That is, the improvement in lifetime is 43× fold.

One concern about using the ring-shaped gate transistor configuration is the increase in device area. However, if the total area of a circuit, such as a power amplifier (PA) Monolithic Microwave Integrated Circuit (MMIC), is considered, then it becomes apparent that the contribution of Ring-HEMT area to the overall area of the circuit increases only slightly.

FIG. 8 illustrates a layout of a power amplifier MMIC 80 having eight HEMT cells 82. The MMIC 80 is a conventional circuit and thus, its other components will not be described in further detail herein. The dimensions of each cell is 2.8×2.1 mm, for an area of 5.9 mm². The active HEMT cells 82 occupy about 0.22 mm² of the MMIC 60 footprint, which is less than 4% of the total area. Thus, even if the area of each HEMT 82 was increased by 100%, the total increase in MMIC area would only be around 4% only. An alternative approach to reducing the temperature would be to increase the gate pitch. However, to achieve similar temperatures to those of the ring-shaped HEMT, the gate pitch would need to be quadrupled along one dimension perpendicular to the gates and, consequently, the area will quadruple. Additionally, the paths length difference will be severe, and the increase in $C_{ds}$, and $L_s$ will be multi-fold.

Experimental Results

Several HEMTs were fabricated for evaluation by the inventors. The HEMTs included AlGaN/GaN HEMT epitaxial layers fabricated on metal organic chemical vapor deposition (MOCVD) grown 3-inch semi-insulating 6H-SiC substrates. The material has an AlN nucleation layer on SiC substrates. The epitaxial layers consist of an un-doped GaN channel layer, an AlN barrier layer, an un-doped AlGaN layer, and a GaN cap layer in the gate channels between the corresponding source and drain. Device isolations were formed by a mesa etch using reactive-ion-etching (RIE). Ti/Al-based metal stack and Rapid Thermal Anneal (RTA) were used for source and drain ohmic contacts. Contact resistances were measured to be less than 0.4 ohm-mm. Gate openings were defined by electron-beam (e-beam) lithography. Gates were recessed using an inductively coupled plasma (ICP) etch followed by Pt/Au metal deposition. A drain current density of about 1000 mA/mm was achieved at 10 V drain voltage and 1 V gate voltage.

Figure 9:
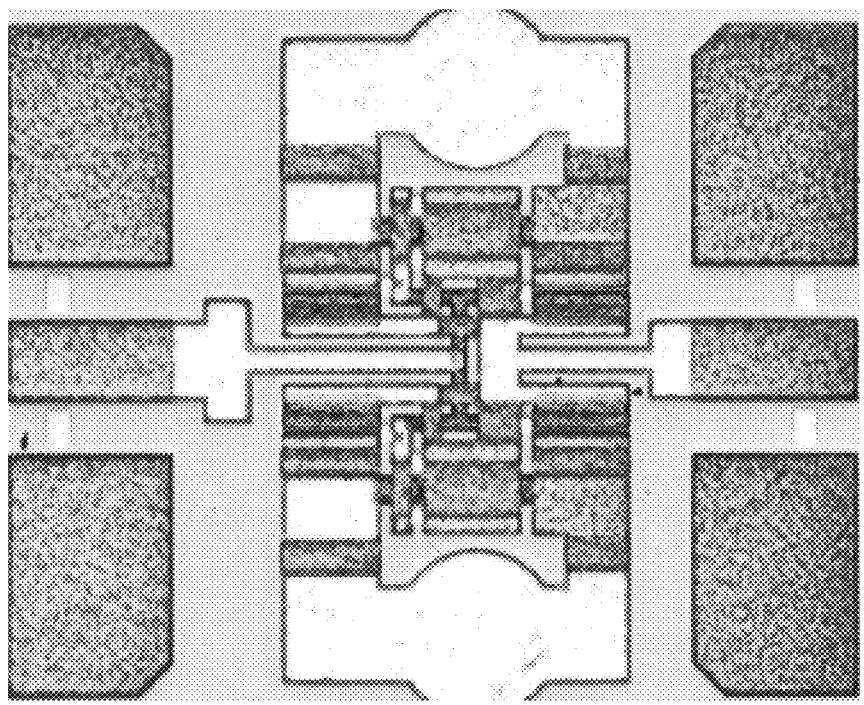

FIGS. 9 and 10 are photographs of a ring-shaped HEMT according to an embodiment and a conventional HEMT, respectively, which were fabricated and evaluated. In FIGS. 9 and 10, the gates are shown covered with air-bridges connecting each source island.

FIG. 9 shows a ring-shaped HEMT with the same gate periphery, 600 μm, according to an embodiment. Here, the distance is maximized between the gates while keeping the paths length for all fingers roughly equal. The increase in core HEMT area, compared to a regular HEMT, is about 50%. With the increased area, some of the internal capacitances are expected to increase. However, that may be tolerated for the trade-off of a lower channel temperature, especially for wide bandgap semiconductors (such as GaN, and SiC) where the performance (gain, output power, and noise), and subsequently, the application of the device is frequently limited by heat dissipation. The temperature and voltage quantities are similar in that both follow Laplace's equation. To reduce temperature, the heating elements should be distributed similar to charges on a conducting disk.

FIG. 10 shows a conventional HEMT with 0.25 μm gate length, 600 μm (8×75 μm) gate periphery, 28.5 μm gate pitch, dissipating 6 W (30 V×200 mA).

Figure 11:
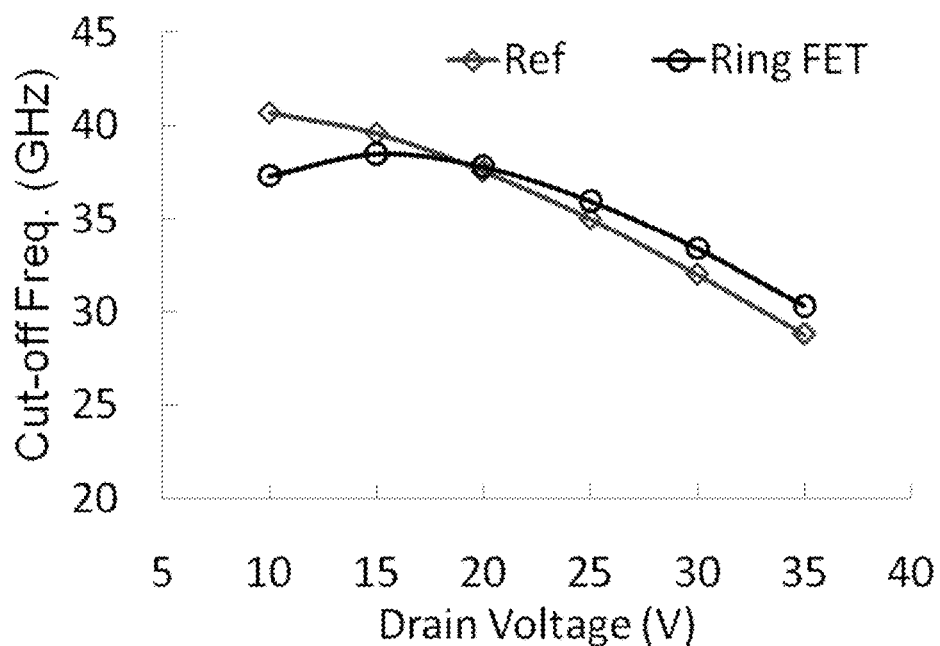
FIG. 11 is a plot that shows the cutoff frequency $f_t$ as a function of bias for the conventional HEMT and the ring-shaped HEMT according to an embodiment.

FIG. 11 is a plot that shows the cutoff frequency $f_t$ as a function of bias for the conventional HEMT and the ring-shaped HEMT according to an embodiment. An approximate expression for the cutoff frequency is $f_t = g_m/2\pi(C_{gs}+C_{gd})$, where $g_m$ is the transconductance, $C_{gs}$, is the gate-source capacitance, and $C_{gd}$ is the gate-drain capacitance.

The bias current was kept constant at 200 MA, 40% of the $I_{dss}$. As the plot shows, $f_t$ drops with drain voltage due to heating, as the inventors expected. However, the rate of deterioration of $f_t$ with bias is greater for the conventional HEMT. Additionally, at full bias (approximately 30V), the difference of $f_t$ between the conventional HEMT and the ring-shaped HEMTs is insignificant. In fact, the ring-shaped HEMT slightly outperforms the conventional HEMT. The equivalent circuit was extracted to find the internal capacitances.

Table 2, below, shows the extracted capacitance values (per mm) of gate-source capacitance $C_{gs}$, gate-drain capacitance $C_{gd}$, and drain-source capacitance $C_{ds}$. The increase in capacitances is moderate. The growth of capacitances can probably be reduced through a more careful layout. The $P_{1dB}$ of all the devices was measured at 10 GHz using a load pull system.

TABLE 2

| Extracted Equivalent Circuit Capacitances (pF/mm) | | | |
| --- | --- | --- | --- |
| Type | $C_{gs}$ | $C_{gd}$ | $C_{ds}$ |
| Conventional HEMT | 0.710 | 0.14 | 0.09 |
| Ring-shaped HEMT | 0.711 | 0.23 | 0.14 |

Figure 12:
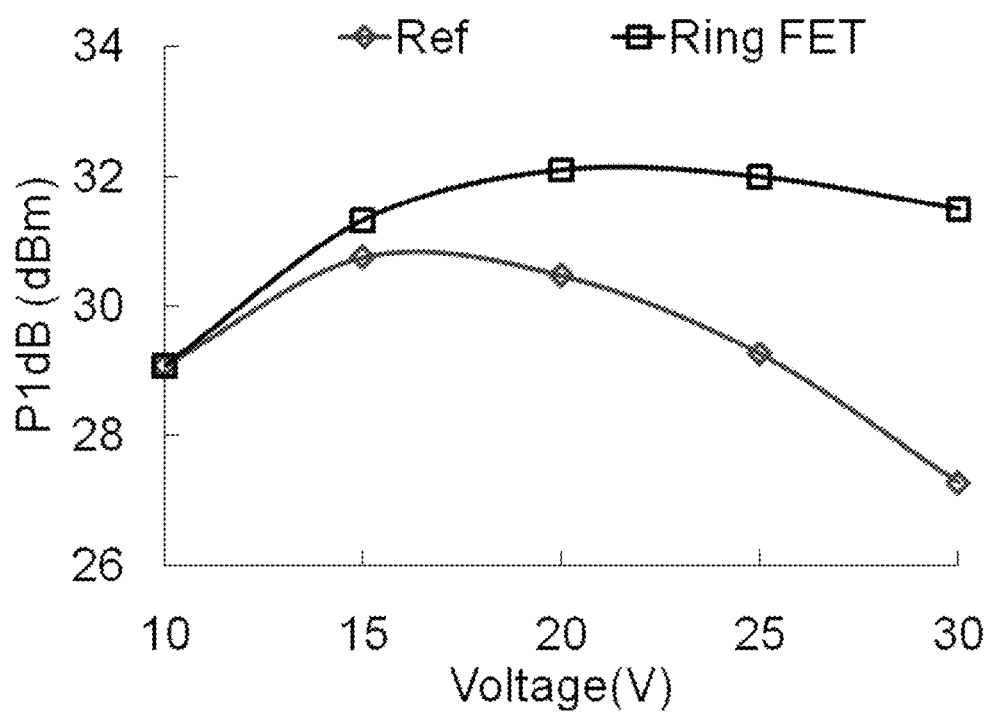
FIG. 12 is a plot that shows the measured, change in output power ($P_{1dB}$) as th$_e$ drain voltage is increased for three devices of each type showing improved performance of the ring-shaped HEMT.

FIG. 12 is a plot that shows the change in output power ($P_{1dB}$) as the drain voltage is increased for three devices of each type. The performance of the devices was consistently obtained.

Figure 13:
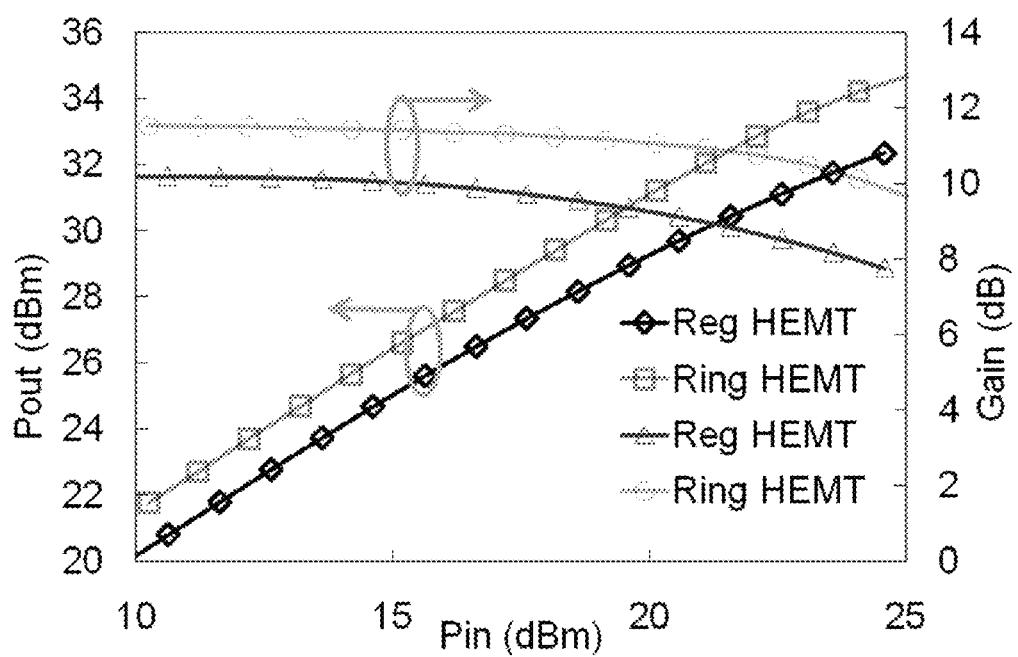
FIG. 13 is a plot that shows sample measured, power drive curves for a conventional HEMT, and a ring-shaped HEMT showing improved performance of the ring-shaped HEMT.

FIG. 13 is a plot that shows sample power drive curves for a conventional HEMT, and a ring-shaped HEMT, where $V_{ds}$=25 V. At low bias (approximately 10 V), the output power for both the HEMTs are similar. However, the conventional HEMT's output power deteriorates quickly with bias voltage due to heating. The ring-shaped HEMT consistently outperforms the conventional HEMT at higher biases.

The reduction in heating comes at the expense of a moderate increase in area and capacitances. The results show significant performance enhancements at 10 GHz. Compared to a conventional HEMT, the ring-shaped HEMT provides a drop in channel temperature from 178° C. to 138° C. accompanied by a 3 dB increase in output power at 30 V bias, and 43× fold increase in lifetime. Additionally, transistor heating causes memory effects which degrade the linearity. Thus, it is expected that the ring-shaped HEMT will have better linearity.

While the experiments described herein where primarily directed to AlGaN/GaN HEMTs, it is believed that other semiconductor materials (e.g., Si, GaAs, SiC, etc.) with the transistor devices (such as HEMTs and FETs) should provide similar perform improvement.

Various transistors may be configured to include a ring-shaped transistor configuration or layout according to embodiments. In some embodiments, the ring-shaped transistor may be configured as a FET, such as a HEMT, a pseudomorphic HEMT (pHEMT), a metal oxide field effect transistor (MOSFET), or a metal semiconductor field effect transistor (MESFET). For example, high-voltage (e.g., 28 V or more) GaAs pHEMT devices may benefit by embodiments of the present invention, given that self-heating is the main limiting factor for these devices.

The ring-shaped transistors may be included in various electronic devices. The device may further be provided with matching circuits at the input and output of the device to form an active circuit, such as an amplifier. In some instances, the device and circuits (passive elements) may be fabricated in the same process sequence and on a same chip.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present disclosure and its practical applications, to thereby enable others skilled in the art to best utilize the invention and various embodiments with various modifications as may be suited to the particular use contemplated.

Various elements, devices, modules and circuits are described above in associated with their respective functions. These elements, devices, modules and circuits are considered means for performing their respective functions as described herein.

While the foregoing is directed to embodiments of the present invention, other and further embodiments of the invention may be devised without departing from the basic scope thereof, and the scope thereof is determined by the claims that follow.

The invention claimed is:

1. A ring-shaped transistor comprising:
a set of gates, each gate being disposed between a corresponding source and a corresponding drain;
wherein the set of gates are arranged such that there are different conductive pathways to different gates, and all of the set of gates cannot be aligned with fewer than three imaginary straight lines drawn through the gates, with one of the imaginary straight lines passing only once though each of the set of gates.

2. The transistor of claim 1, wherein at least two gates are arranged in a non-parallel configuration with another gate.

3. The transistor of claim 1, wherein at least two gates are arranged in a parallel configuration with another gate.

4. The transistor of claim 1, wherein the set of gates are arranged in a circuitous or serpentine arrangement such that the gates are connected by one or more conductive pathways each having at least two linear segments.

5. The transistor of claim 1, wherein the set of gates are arranged radially from a central portion.

6. The transistor of claim 1, wherein at least two of gates do not have a fixed gate-gate spacing.

7. The transistor of claim 1, wherein all gates are electrically connected in parallel, all drains are electrically connected in parallel, and all sources are electrically connected in parallel.

8. The transistor of claim 1, wherein the different conductive pathways have a symmetric pattern.

9. The transistor of claim 1, wherein the signal path lengths to all of the gate/source/drain junctions are substantially the same.

10. The transistor of claim 1, wherein the transistor is configured as a field effect transistor (FET), a high electron mobility transistor (HEMT), a pseudomorphic HEMT (pHEMT), a metal oxide field effect transistor (MOSFET), or a metal semiconductor field effect transistor (MESFET).

11. A semiconductor integrated circuit comprising: the ring-shaped transistor of claim 1.

12. An electronic device comprising: the ring-shaped transistor of claim 1.

13. The device of claim 12, wherein the device is a Monolithic Microwave Integrated Circuit (MMIC).

14. A method of fabricating a ring-shaped transistor, the method comprising:
forming a ring-shaped transistor comprising: a set of gates, each gate being disposed between a corresponding source and a corresponding drain;
wherein the set of gates are arranged such that there are different conductive pathways to different gates, and all of the set of gates cannot be aligned with fewer than three imaginary straight lines drawn through the gates, with one of the imaginary straight lines passing only once though each of the set of gates.

15. The method of claim 14, further comprising: forming a layer where transistor action occurs on a substrate.

16. The method of claim 15, wherein the layer where transistor action occurs is epitaxially formed.

17. The method of claim 15, further comprising: forming a buffer layer between the layer where transistor action occurs and the substrate.

18. The method of claim 17, wherein the buffer layer is epitaxially formed.

19. The method of claim 14, wherein all gates are electrically connected in parallel, all drains are electrically connected in parallel, and all electrically sources are connected in parallel.

\* \* \* \* \*